United States Patent
Augustino et al.

(10) Patent No.: US 8,276,604 B2
(45) Date of Patent: Oct. 2, 2012

(54) PERIPHERALLY ENGAGING ELECTRODE CARRIERS AND ASSEMBLIES INCORPORATING THE SAME

(75) Inventors: Jason Augustino, Fremont, CA (US); Armen Avoyan, Glendale, CA (US); Yan Fang, Fremont, CA (US); Duane Outka, Fremont, CA (US); Hong Shih, Walnut, CA (US); Stephen Whitten, Danville, CA (US)

(73) Assignee: Lam Research Corporation, Fremont, CA (US)

( * ) Notice: Subject to any disclaimer, the term of this patent is extended or adjusted under 35 U.S.C. 154(b) by 1129 days.

(21) Appl. No.: 12/164,288

(22) Filed: Jun. 30, 2008

(65) Prior Publication Data

US 2009/0321018 A1 Dec. 31, 2009

(51) Int. Cl.
*H05H 1/34* (2006.01)
*H01J 37/02* (2006.01)
*H01J 37/32* (2006.01)
*H01L 21/00* (2006.01)
*C23C 16/00* (2006.01)

(52) U.S. Cl. ......... 134/137; 134/59; 134/85; 134/166 R; 156/345.1; 156/345.14; 156/345.23; 156/345.51; 156/345.47; 118/723 E

(58) Field of Classification Search .................. 134/1.3, 134/2, 3, 22.12, 22.18, 26, 28, 29, 30, 34, 134/37, 59, 61, 84, 85, 94.1, 95.1, 95.2, 137, 134/166 R, 170, 182, 183; 156/345.1, 345.14, 156/345.23, 345.43, 345.47, 345.51; 118/723 E
See application file for complete search history.

(56) References Cited

U.S. PATENT DOCUMENTS

| | | | |
|---|---|---|---|
| 6,073,577 A | 6/2000 | Lilleland et al. | |
| 6,148,765 A | 11/2000 | Lilleland et al. | |
| 6,194,322 B1 | 2/2001 | Lilleland et al. | |
| 6,245,192 B1 | 6/2001 | Dhindsa et al. | |
| 6,258,228 B1 | 7/2001 | Reiss | |
| 6,376,385 B2 | 4/2002 | Lilleland et al. | |
| 6,506,254 B1 | 1/2003 | Bosch et al. | |
| 7,767,028 B2 * | 8/2010 | Augustino et al. | 134/28 |
| 7,942,973 B2 * | 5/2011 | Shih et al. | 134/1 |
| 8,075,701 B2 * | 12/2011 | Avoyan et al. | 134/26 |
| 8,075,703 B2 * | 12/2011 | Avoyan et al. | 134/28 |

(Continued)

FOREIGN PATENT DOCUMENTS

JP 7066180 A 3/1995

OTHER PUBLICATIONS

International Search Report and Written Opinion dated Feb. 11, 2010 pertaining to International application No. PCT/US2009/048797.

*Primary Examiner* — Jeffrie R Lund
(74) *Attorney, Agent, or Firm* — Dinsmore & Shohl LLP

(57) ABSTRACT

In accordance with one embodiment of the present disclosure, an assembly is provided comprising a multi-component electrode and a peripherally engaging electrode carrier. The peripherally engaging electrode carrier comprises a carrier frame and a plurality of reciprocating electrode supports. The multi-component electrode is positioned in the electrode accommodating aperture of the carrier frame. The backing plate of the electrode comprises a plurality of mounting recesses formed about its periphery. The reciprocating electrode supports can be reciprocated into and out of the mounting recesses. Additional embodiments of broader and narrower scope are contemplated.

16 Claims, 7 Drawing Sheets

U.S. PATENT DOCUMENTS

| | | | |
|---|---|---|---|
| 8,171,877 B2 * | 5/2012 | Augustino et al. | 118/503 |
| 2005/0241765 A1 | 11/2005 | Dhindsa et al. | |
| 2006/0138081 A1 | 6/2006 | Huang et al. | |
| 2006/0141787 A1 | 6/2006 | Ren et al. | |
| 2006/0141802 A1 | 6/2006 | Shih et al. | |
| 2007/0068629 A1 | 3/2007 | Shih et al. | |
| 2007/0235660 A1 | 10/2007 | Hudson | |
| 2007/0284246 A1 | 12/2007 | Keil et al. | |
| 2008/0015132 A1 | 1/2008 | Ren et al. | |
| 2008/0092920 A1 | 4/2008 | Shih et al. | |
| 2008/0223401 A1 * | 9/2008 | Augustino et al. | 134/3 |
| 2008/0236618 A1 | 10/2008 | Outka et al. | |
| 2008/0236620 A1 | 10/2008 | Shih et al. | |
| 2009/0321018 A1 * | 12/2009 | Augustino et al. | 156/345.43 |
| 2009/0322199 A1 * | 12/2009 | Augustino et al. | 313/243 |
| 2009/0325320 A1 * | 12/2009 | Avoyan et al. | 438/4 |
| 2010/0108093 A1 | 5/2010 | Peng et al. | |
| 2010/0139692 A1 | 6/2010 | Avoyan et al. | |
| 2010/0144246 A1 * | 6/2010 | Avoyan et al. | 451/28 |
| 2011/0180117 A1 * | 7/2011 | Shih et al. | 134/198 |
| 2012/0013242 A9 * | 1/2012 | Augustino et al. | 313/243 |
| 2012/0108152 A1 * | 5/2012 | La Croix et al. | 451/365 |

* cited by examiner

US 8,276,604 B2

PERIPHERALLY ENGAGING ELECTRODE CARRIERS AND ASSEMBLIES INCORPORATING THE SAME

SUMMARY

The present disclosure relates generally to an electrode carrier for use in handling and processing electrodes and, more particularly, to a peripherally engaging electrode carrier for multi-component electrodes that are used as excitation electrodes in plasma processing systems. Although the context of the present invention are not limited to particular types of electrodes or the context in which the electrodes to be carried have been used, for the purposes of illustration, the carrier is illustrated herein with reference to silicon-based electrode assemblies where an "outer," ring-shaped, silicon electrode is bonded to a backing plate. Those practicing the present invention will find that some of the carrier designs proposed herein will enjoy favorable utility in the context of a variety of types of electrodes and non-electrodes.

FIG. 1 illustrates an electrode assembly 10 comprising an inner showerhead electrode 20 and an outer ring-shaped electrode 30. FIG. 2 illustrates the inner multi-component electrode 20 in isolation. FIG. 3 illustrates the outer multi-component electrode 30 in isolation. Generally, the electrode assembly 10 is formed from two types of multi-component electrodes—a disc-shaped, inner multi-component showerhead electrode 20 and a ring-shaped, outer multi-component electrode 30. Both of these multi-component electrodes 20, 30 comprise a silicon electrode 22, 32 bonded to an electrically conductive backing plate 24, 34. The inner electrode illustrated in FIG. 1 and comprises an array of gas passages 26 commonly referred to in the art as showerhead passages. The outer electrode 30 comprises a series of peripheral silicon segments pieced together to surround the periphery of the inner electrode 20. With the exception of the peripheral axial bores 35 that are formed along the periphery of the backing plate 34 of the outer electrode 30, other particular features of the electrodes 20, 30 and the electrode assembly 10 are beyond the focus of the present disclosure and, as such, are not described in detail herein. Further teachings regarding the structure of electrode assemblies similar to that illustrated in FIGS. 1-3 can be found in US Pub. Nos. 2007/0068629, 2007/0235660, and 2007/0284246, pertinent portions of which are incorporated herein by reference. Additional related teachings can be found in U.S. Pat. Nos. 6,073,577, 6,148,765, 6,194,322, 6,245,192, 6,376,385, and 6,506,254, and US Pub. No. 2005/0241765.

In accordance with one embodiment of the present disclosure, an assembly is provided comprising a multi-component electrode and a peripherally engaging electrode carrier. The peripherally engaging electrode carrier comprises a carrier frame and a plurality of reciprocating electrode supports. The multi-component electrode is positioned in the electrode accommodating aperture of the carrier frame. The backing plate of the electrode comprises a plurality of mounting recesses formed about its periphery. The reciprocating electrode supports can be reciprocated into and out of the mounting recesses.

In another embodiment, a peripherally engaging electrode carrier is provided where the carrier frame comprises a plurality of keyway slots. The reciprocating electrode supports comprise keyway projections that cooperate with the keyway slots to restrict movement of the supports along the linear reciprocating paths defined by the supports.

In yet another embodiment, a peripherally engaging electrode carrier is provided where the reciprocating electrode support comprises a purge gas passageway that extends from a purge gas inlet displaced from the electrode engaging end of the electrode support to a purge gas outlet that is proximate to the electrode engaging end of the electrode support. Additional embodiments of broader and narrower scope are contemplated.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

Figure 1:
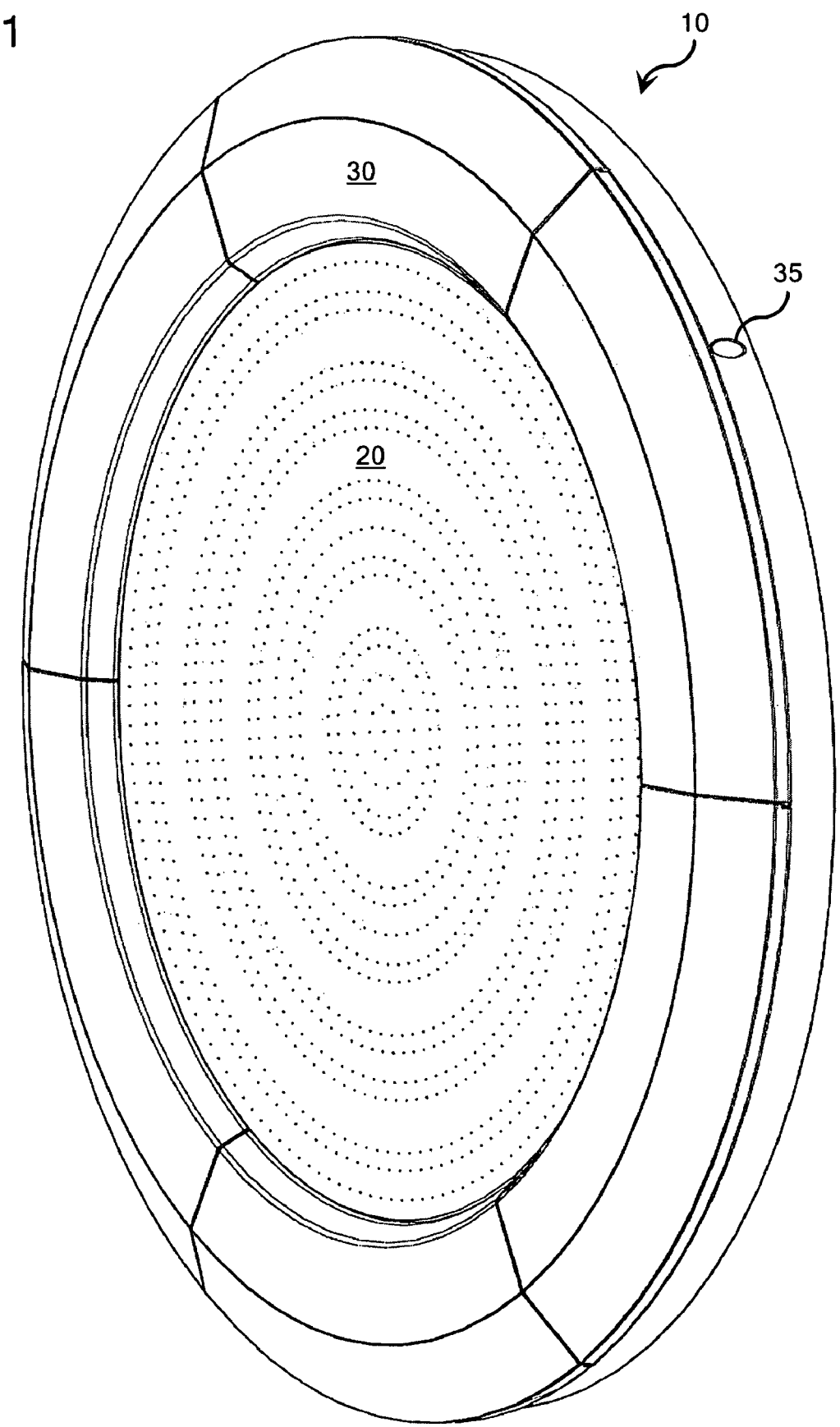
FIG. 1 illustrates an electrode assembly comprising an inner showerhead electrode and an outer ring-shaped electrode.
Figure 2:
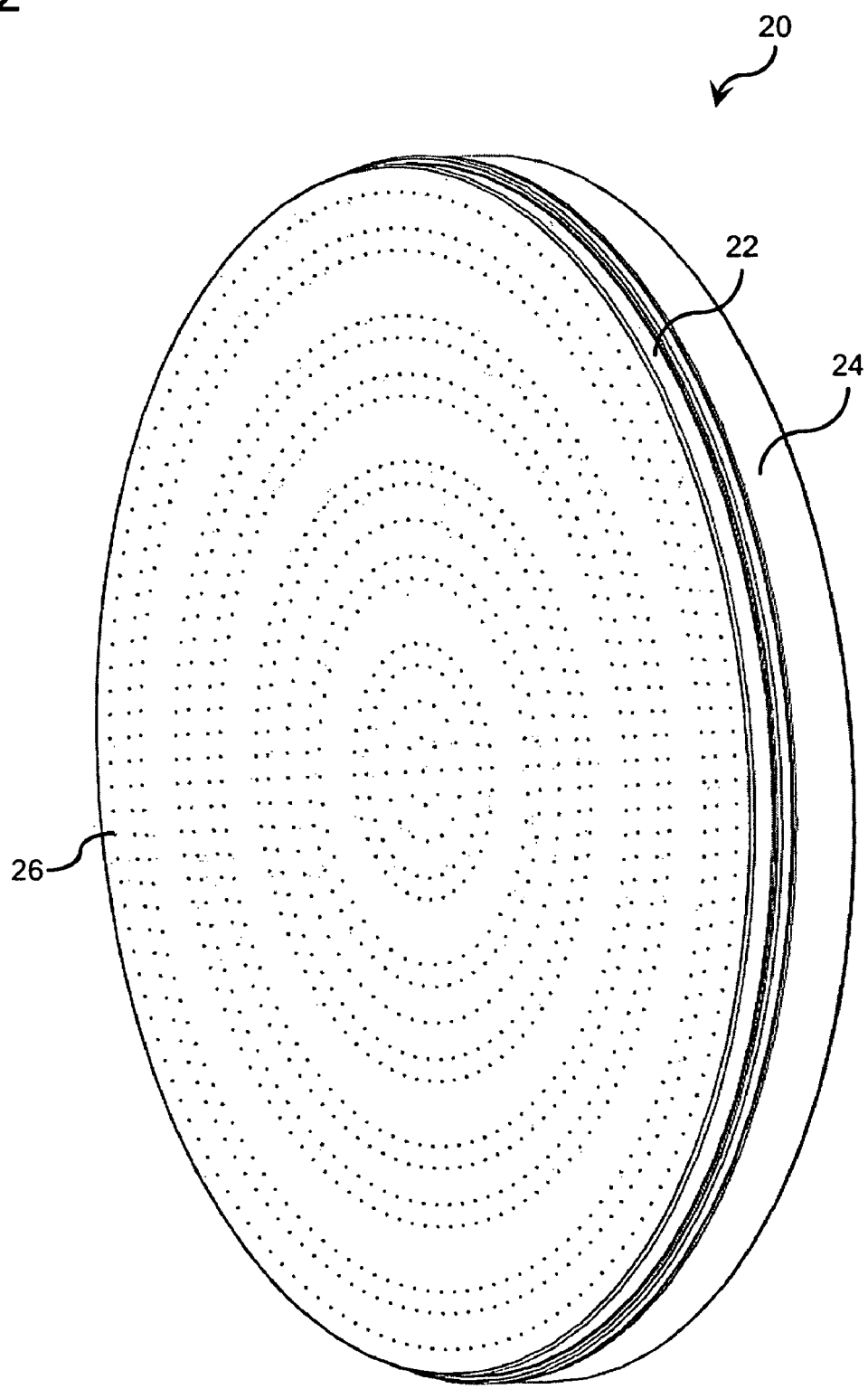
FIG. 2 illustrates the inner electrode of FIG. 1 in isolation.
Figure 3:
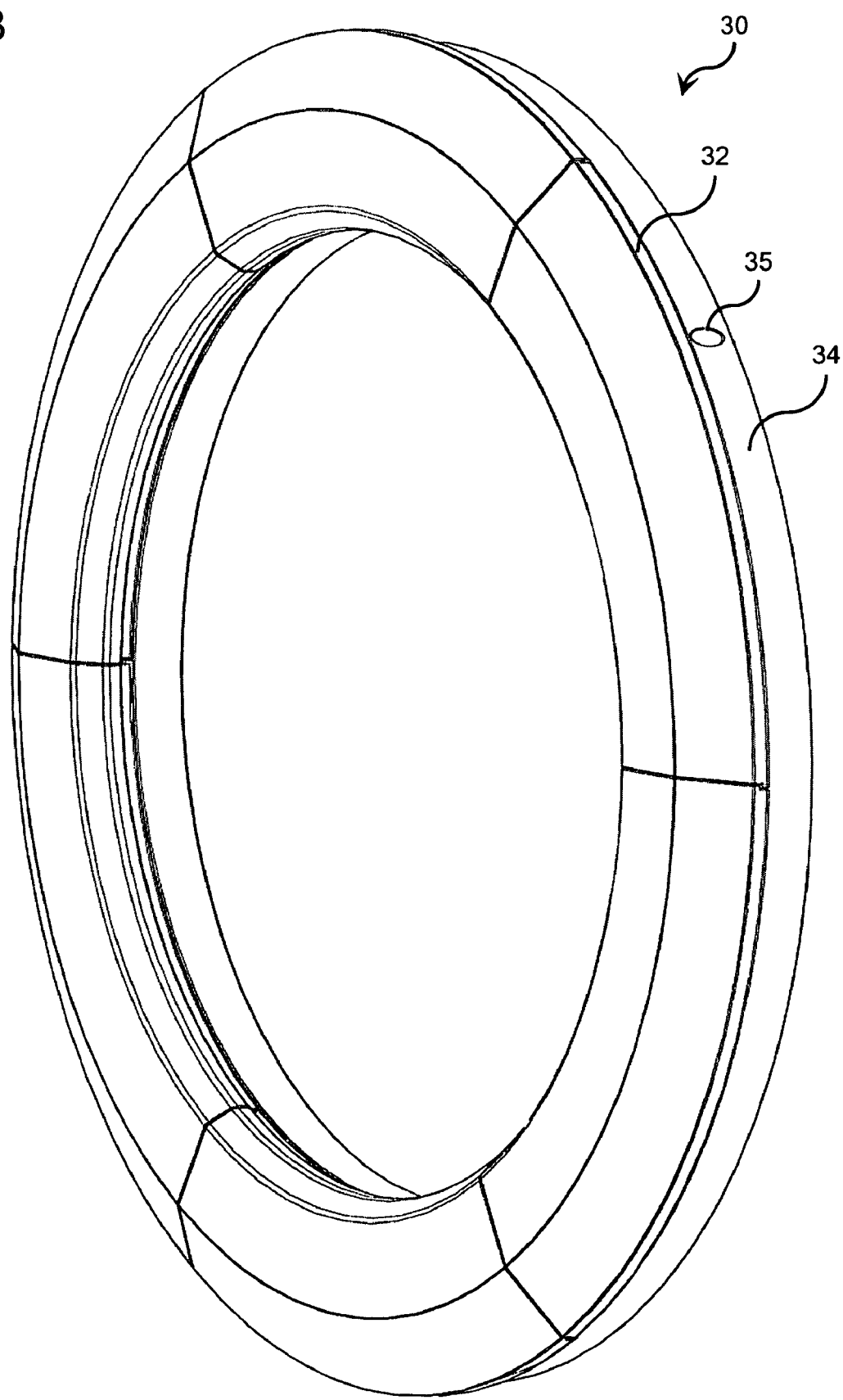
FIG. 3 illustrates the outer electrode of FIG. 1 in isolation.

As is noted above, the present disclosure relates to a peripherally engaging carrier for multi-component electrodes. The concepts of the present disclosure should not be limited to particular electrode or electrode assembly configurations. For example, the multi-component, inner and outer electrodes 20, 30 illustrated in FIGS. 1-3 may comprise any of a variety of backing plate configurations including, but not limited to, electrically conductive aluminum-based or graphite-based backing plates 24, 34. In addition, the silicon electrodes 22, 32 may be bonded to the corresponding electrically conductive backing plate 24, 34 in any of a variety of manners. Typically, a polymeric adhesive is applied at the interface between the electrode and backing plate and mechanical means are used to secure the bond. It is also contemplated that a non-adhesive gasket may be used at the interface and the electrode and backing plate may be bonded mechanically. With regard to the silicon electrodes 22, 32, it is noted that reference herein to a silicon electrode or an electrode comprising silicon should be read to cover any of a variety of electrodes that utilize any of a variety of forms of silicon in their construction.

Figure 4:
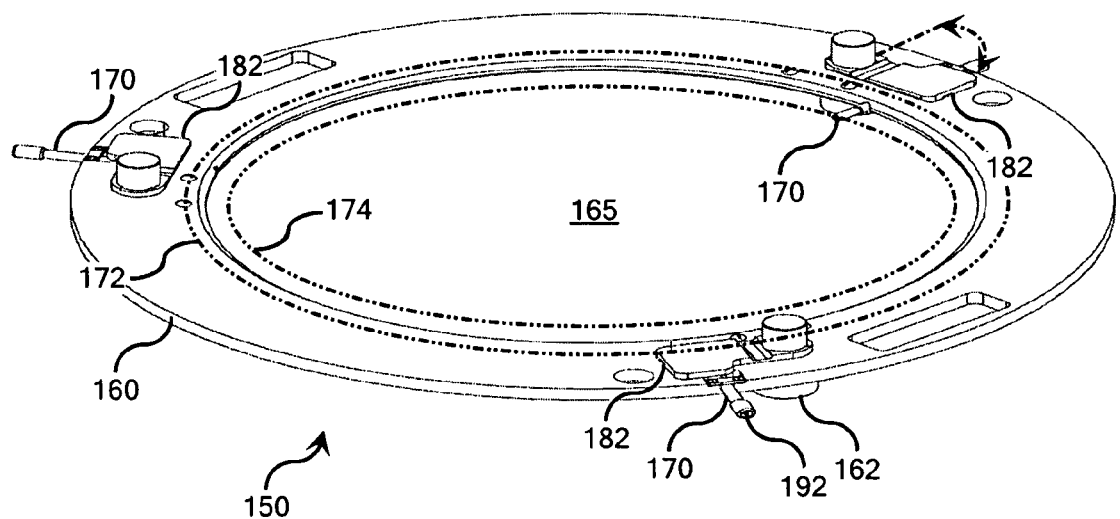
FIG. 4 illustrates a peripherally engaging electrode carrier according to one embodiment of the present disclosure.
Figure 5:
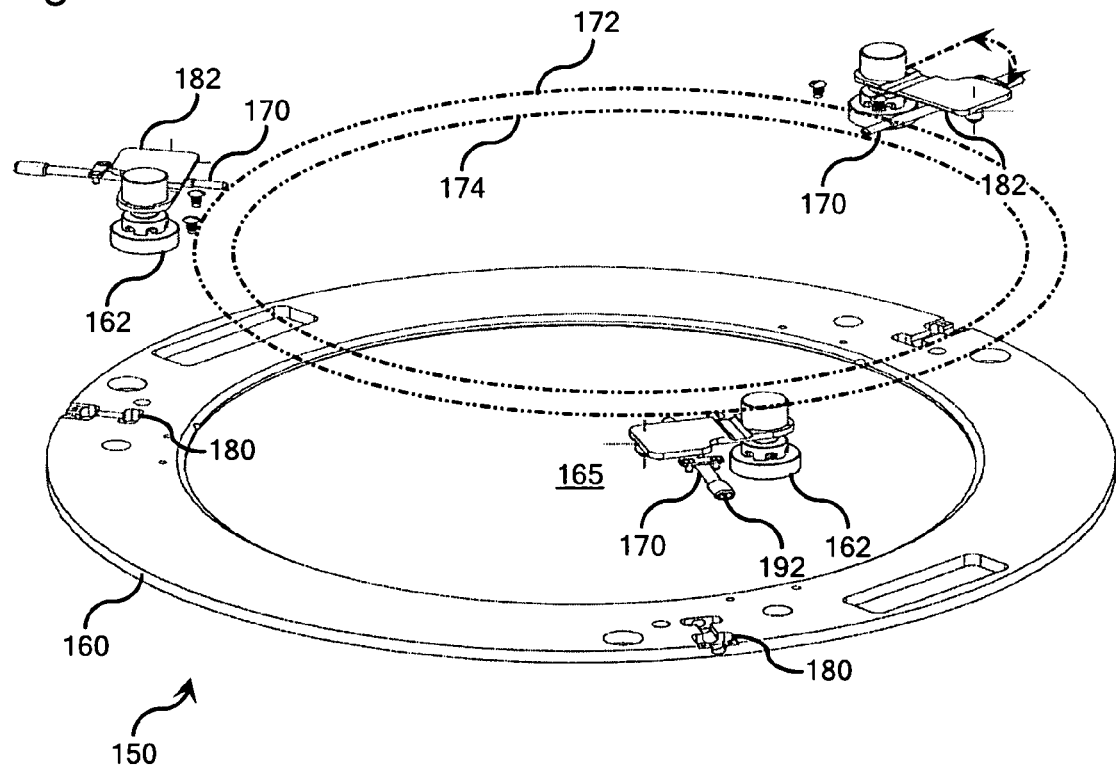
FIG. 5 is a partially exploded view of the carrier illustrated in FIG. 4.

Although the particular features of the peripherally engaging carrier illustrated herein may vary, one particular configuration according to the present disclosure is illustrated herein with reference to FIGS. 4-10. More specifically, FIGS. 4 and 5 illustrate a peripherally engaging electrode carrier 150 that can be used to hold any of a variety of types of electrodes including, but not limited to, the outer ring-shaped electrode 30 illustrated in FIGS. 1 and 3. Generally, the peripherally engaging electrode carrier 150 comprises a carrier frame 160 and a plurality of reciprocating electrode supports 170.

The carrier frame 160 comprises an electrode accommodating aperture 165 in which the outer ring-shaped electrode 30 can be positioned. The backing plate 34 of the electrode 30 comprises a plurality of mounting recesses 35 formed about its periphery. The reciprocating electrode supports 170 are configured to reciprocate between an outer retracted periphery 172 and an inner electrode-engaging periphery 174, which is smaller than the electrode accommodating aperture 165. When positioned at the inner electrode-engaging periphery 174, the reciprocating electrode supports 170 will extend into the mounting recesses 35 and support the electrode 30. When positioned at the outer retracted periphery 172, the reciprocating electrode supports 170 provide full clearance to the electrode accommodating aperture 160. Although the mounting recesses 35 are illustrated as axial bores, it is noted that any of a variety of recess configurations may be employed in practicing the present invention.

Although the reciprocating electrode supports 170 of the present disclosure are illustrated herein with reference to a linearly reciprocating keyway configuration, it is contemplated that a variety of mechanical configurations can be employed to accomplish reciprocating movement of the electrode supports 170 between the outer retracted periphery 172 and an inner electrode-engaging periphery 174. For example, it is contemplated that the reciprocating movement could be linear, rotational, or could follow a complex path having a plurality of linear and rotational components.

Referring to FIGS. 6-9, in the illustrated embodiment, each of the reciprocating electrode supports 170 is configured as a support pin that is aligned with a linear reciprocating path 175. The carrier frame 160 comprises a plurality of keyway slots 180, each of which is configured to define termination points A, B of the linear reciprocating path 175. More specifically, the reciprocating electrode support 170 comprises a keyway projection 162 that cooperates with the keyway slot 180 to restrict movement along the linear reciprocating path 175 beyond the termination points A, B.

Figure 8:
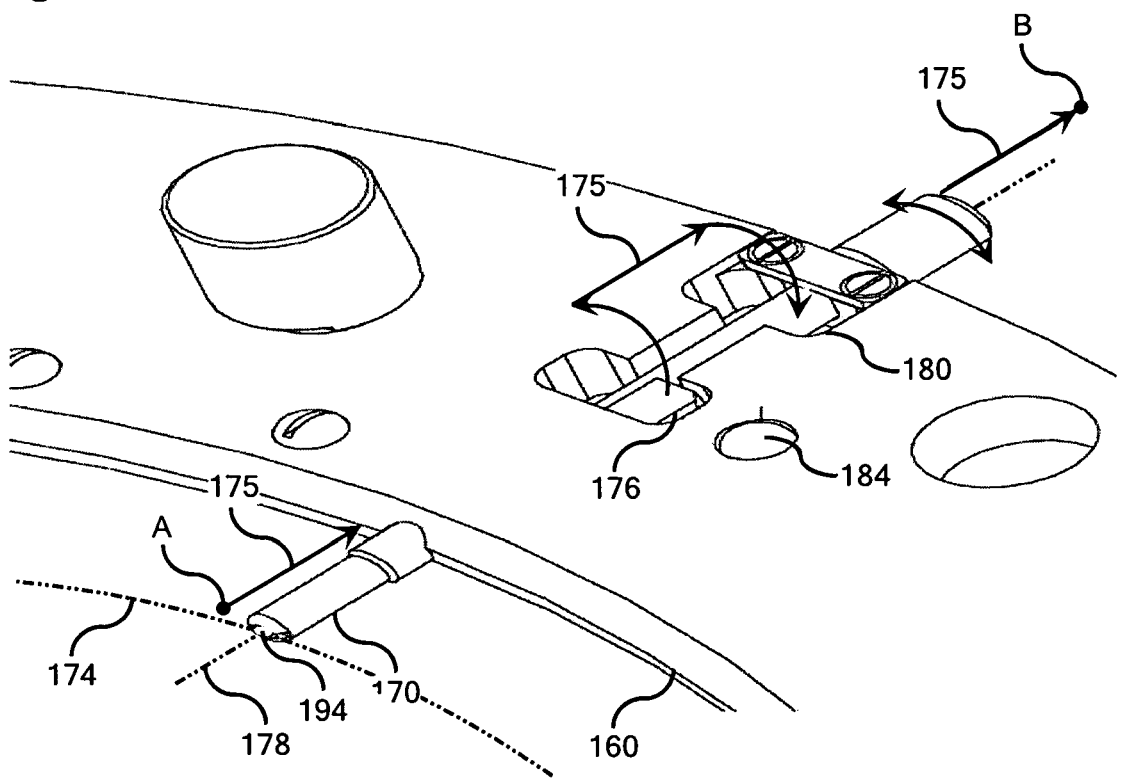
Figure 9:
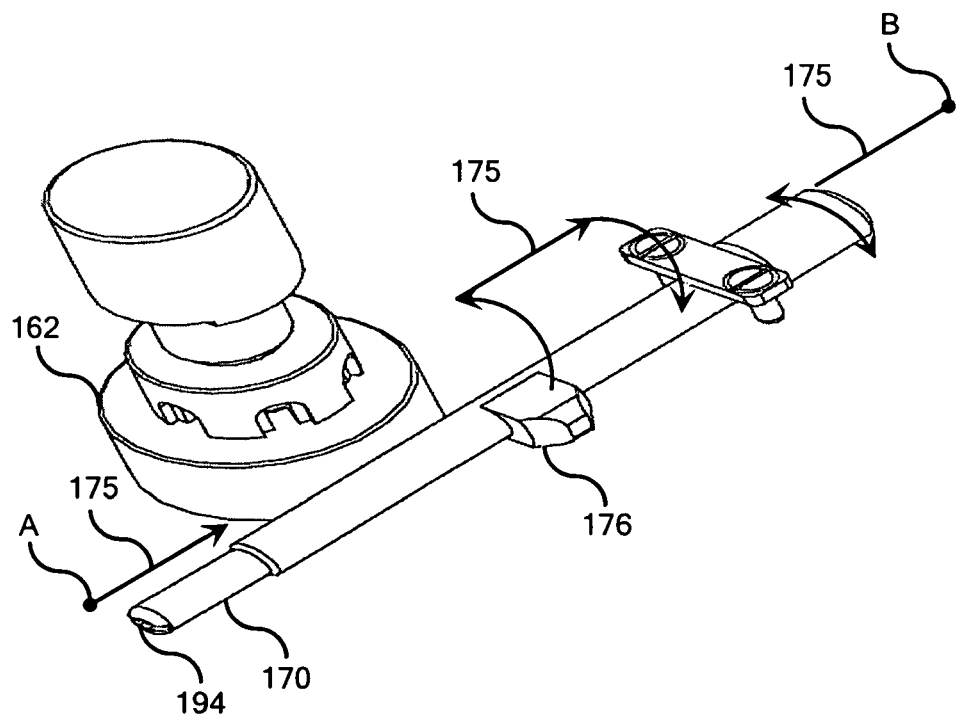

As is illustrated in FIGS. 8 and 9, the reciprocating electrode support 170 is rotatable about its longitudinal axis 178. By rotating the reciprocating electrode support 170 in the manner indicated in FIGS. 8 and 9, the keyway projection 176 can be rotated about the longitudinal axis 178 to transition from a stationary state, in which the keyway slot 180 restricts movement of the reciprocating electrode support 170 along the linear reciprocating path 175, to a reciprocating state, in which the reciprocating electrode support 170 can be moved freely along the linear reciprocating path 175 between the termination points A, B.

To secure the electrode 30 in the peripherally engaging electrode carrier 150, the mounting recesses 35 of the backing plate 34 are aligned with the linear reciprocating paths 175 of the reciprocating electrode supports 170 and each reciprocating electrode support 170 is advanced from termination point B to the inner electrode-engaging periphery 174 by rotating the keyway projection 176 to a position outside of the keyway slot 180 and sliding the reciprocating electrode support 170 to the termination point A. Once termination point A is reached, the keyway projection 176 is returned to the keyway slot 180, a resting state that is illustrated in FIG. 8.

Figure 6:
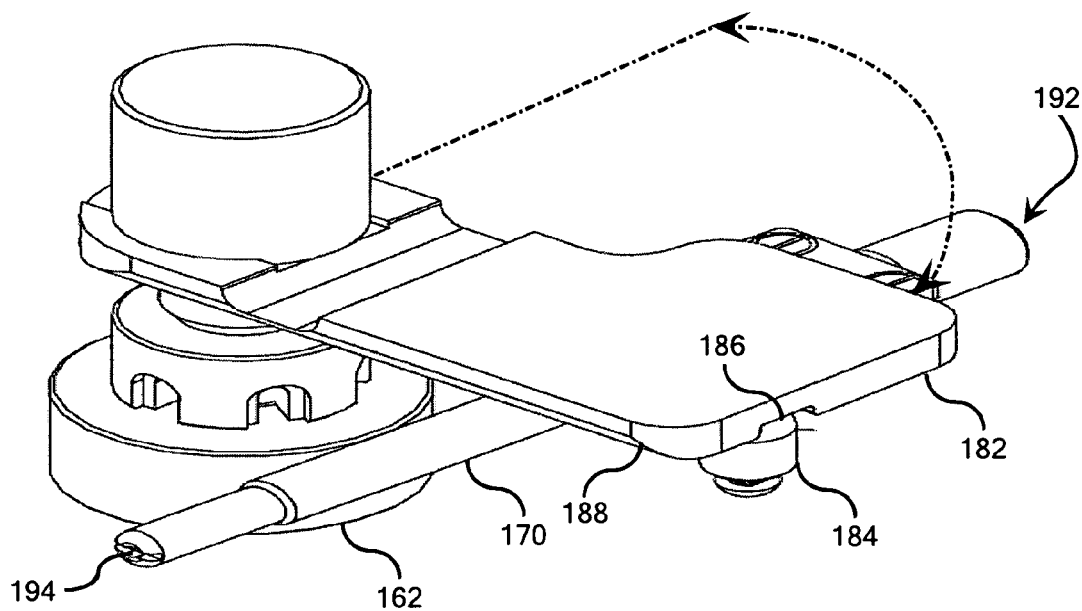
FIGS. 6-9 illustrate a reciprocating electrode support for use in peripherally engaging electrode carriers according to the present disclosure, and the manner in which they reciprocate.
Figure 7:
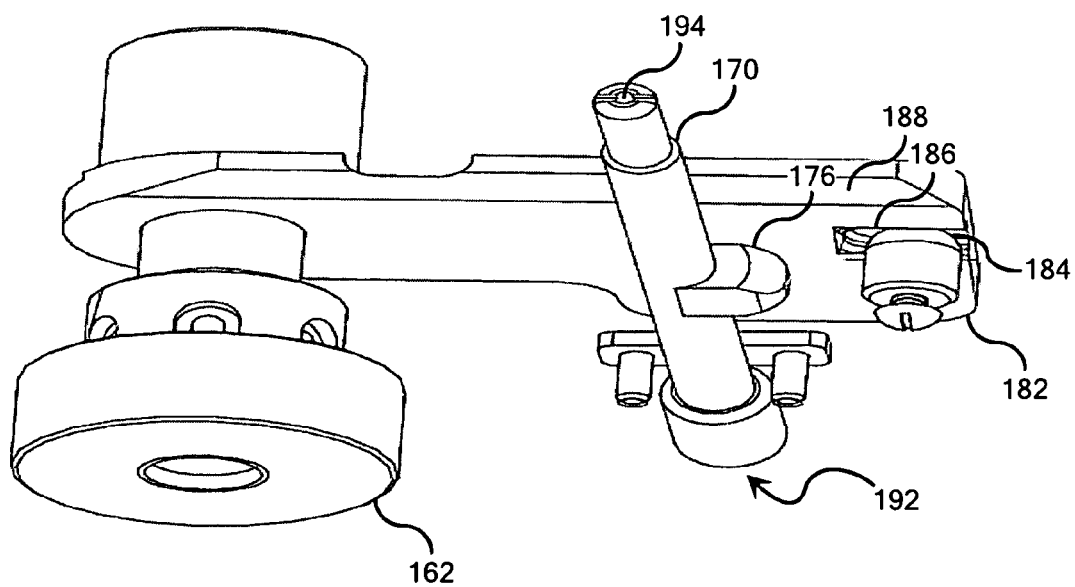

Respective keyway locking plates 182, or other similar hardware, can be provided to fix the reciprocating electrode supports 170 in an advanced or retracted position by preventing rotation of the keyway projections 176. As is illustrated in FIGS. 4 and 6, the keyway locking plates 182 can be rotated back and forth from the locking position about respective pivot axes defined by a set of carrier supports 162. Locator nubs 184, or other similar hardware, may also be provided on the carrier frame 160 to cooperate with receiving slots 186 on the locking plates 182. The locator nubs 184 and the receiving slots 186 of the locking plates 182 can be used to help locate the locking plates 182 over respective ones of the keyway slots 180 to lock-down the keyway projections 176 and the reciprocating electrode supports 170 in a stationary state. In the illustrated embodiment, the locking plates 182 further comprise leading beveled edges 188 that are positioned to facilitate receipt of the locator nubs 184 in the receiving slots 186.

The present inventors have recognized that the reciprocating electrode supports 170 will at least partially obstruct portions of the mounting recesses 35 during reconditioning processes. To address this issue, each reciprocating electrode support 170 can be provided with a purge gas passageway that extends from a purge gas inlet 192 to a purge gas outlet 194 that would be positioned in the mounting recess 35 when an electrode 30 is engaged in the carrier 150. In the illustrated embodiment, the purge gas passageway extends along the longitudinal axis of the reciprocating electrode support 170 and the inlet/outlet configuration is well-suited for coupling a pressurized purge gas supply to the purge gas inlet 192. It is contemplated that any number of passageway configurations would be effective in practicing the present invention, as long as the passageway encourages passage of a pressurized or non-pressurized purge gas through the mounting recess 35.

Figure 10:
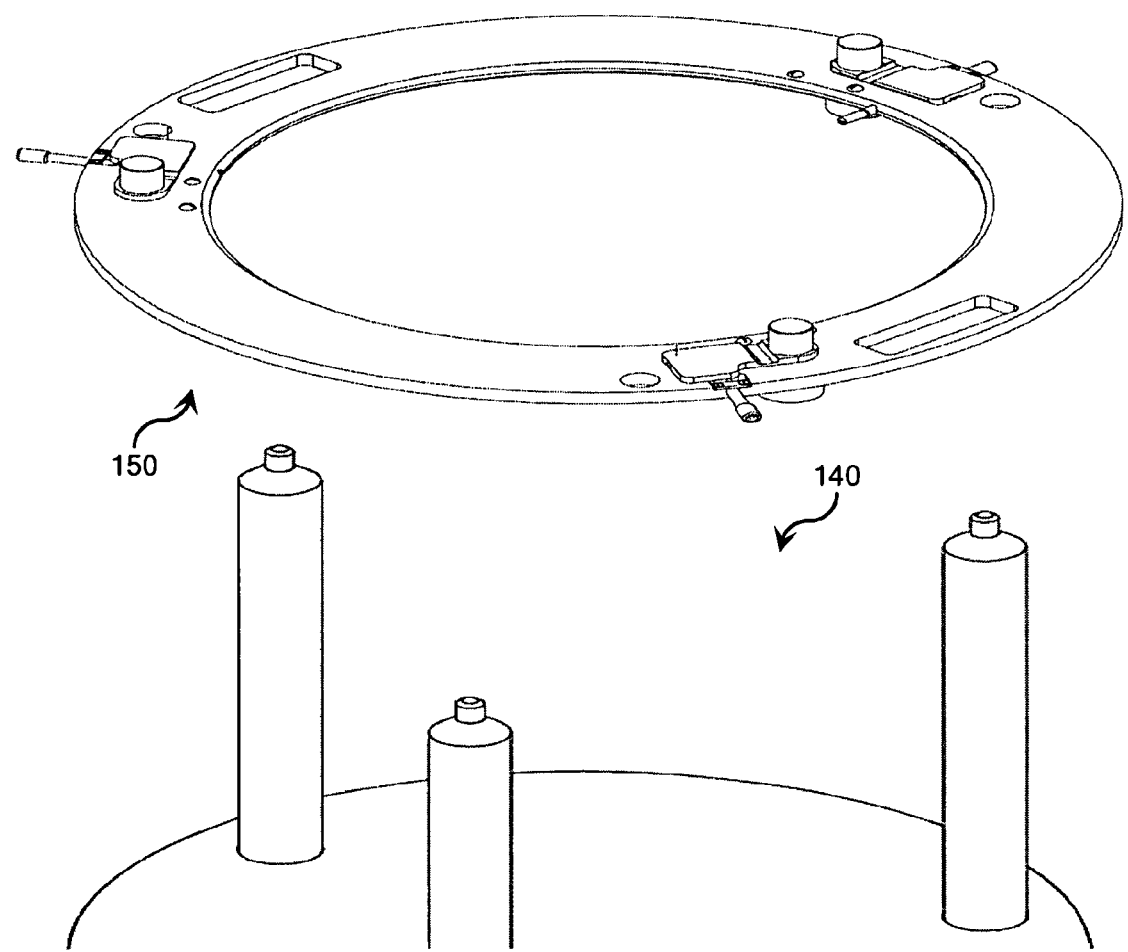
FIG. 10 illustrates a peripherally engaging electrode carrier and an associated tripod stand for use with the carrier.

FIG. 10 illustrates a tripod stand 140 that may be used to support the peripherally engaging electrode carrier 150 during electrode reconditioning operations. The tripod stand 140 comprises at least three carrier supports that can interface with either side of the electrode carrier 150 because the electrode carrier 150 is configured to hold an electrode in a stationary position regardless of its orientation. For the purposes of describing and defining the present invention, it is noted that "reconditioning" operations generally refer to a variety of processes for treating a component and include, but are not limited to, chemical treatment, polishing, cleaning, etc.

It is contemplated that electrodes can be positioned in the electrode-accommodating aperture 165 of the peripherally engaging electrode carrier 150 with the aid of a carrier installation stand that is configured to allow the electrode to sit on a controlled clean surface at the proper height to allow the electrode to be positioned in the electrode accommodating aperture 165.

To reduce the possibility of contamination during reconditioning procedures, the various assembly components described herein can be fabricated using materials that are resistant to oxidation or other process-related degradation. For example, and not by way of limitation, the materials should be chemically resistant to isopropyl alcohol, sulfuric acid, hydrogen peroxide, hydrofluoric acid, nitric acid, acetic acid, and the like. Suitable materials include, but are not limited to, polymers such as polypropylene and polycarbonate for components like the carrier body and PEEK for components of the assembly that are likely to be subject to acute stress, strain, or wear.

It is noted that recitations herein of a component of the present disclosure being "configured" to embody a particular property or function in a particular manner are structural recitations as opposed to recitations of intended use. More specifically, the references herein to the manner in which a component is "configured" denotes an existing physical condition of the component and, as such, is to be taken as a definite recitation of the structural characteristics of the component.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure. Similarly, although some aspects of the present disclosure are identified herein as preferred or particularly advantageous, it is contemplated that the present disclosure is not necessarily limited to these preferred aspects of the invention.

For the purposes of describing and defining the present invention it is noted that the terms "substantially" and "approximately" are utilized herein to represent the inherent degree of uncertainty that may be attributed to any quantitative comparison, value, measurement, or other representation. The terms "substantially" and "approximately" are also utilized herein to represent the degree by which a quantitative representation may vary from a stated reference without resulting in a change in the basic function of the subject matter at issue.

Having described the invention in detail and by reference to specific embodiments thereof, it will be apparent that modifications and variations are possible without departing from the scope of the invention defined in the appended claims.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. An assembly comprising a multi-component electrode and a peripherally engaging electrode carrier, wherein:
   the peripherally engaging electrode carrier comprises a carrier frame and a plurality of reciprocating electrode supports;
   the carrier frame comprises an electrode accommodating aperture;
   the multi-component electrode is positioned in the electrode accommodating aperture and comprises a silicon front face bonded to a non-silicon, electrically conductive backing plate;
   the backing plate comprises a plurality of mounting recesses formed about its periphery;
   the reciprocating electrode supports are configured to reciprocate between an inner electrode-engaging periphery and an outer retracted periphery;
   the inner electrode-engaging periphery is smaller than the electrode accommodating aperture;
   the outer retracted periphery is larger than the inner electrode-engaging periphery; and
   the mounting recesses of the backing plate and the reciprocating electrode supports of the electrode carrier are positioned such that the reciprocating electrode supports can be reciprocated into and out of the mounting recesses by moving the reciprocating electrode supports between the inner electrode-engaging periphery and the outer retracted periphery.

2. An assembly as claimed in claim 1 wherein:
   the reciprocating electrode supports are configured to reciprocate between the inner electrode-engaging periphery and the outer retracted periphery along respective linear reciprocating paths;
   the carrier frame comprises a plurality of keyway slots that are configured to define termination points of corresponding ones of the linear reciprocating paths; and
   the reciprocating electrode supports comprise keyway projections that cooperate with the keyway slots to restrict movement along the linear reciprocating paths beyond the termination points of the linear reciprocating paths.

3. An assembly as claimed in claim 2 wherein:
   the reciprocating electrode supports comprise longitudinal axes about which they are rotatable; and
   the keyway projections can be rotated about the longitudinal axes to transition from a stationary state, in which the keyway slots restrict movement of the reciprocating electrode supports along the linear reciprocating paths, to a reciprocating state, in which the reciprocating electrode supports can be moved along the linear reciprocating paths.

4. An assembly as claimed in claim 3 wherein the electrode carrier further comprises respective keyway locking plates that are configured to prevent rotation of the keyway projections about the longitudinal axes of the reciprocating electrode supports.

5. An assembly as claimed in claim 4 wherein:
   the electrode carrier further comprises locator nubs;
   the locking plates comprise receiving slots for receiving the locator nubs; and
   the locator nubs and the locking plates cooperate to locate the locking plates over respective ones of the keyway slots to prevent rotation of the keyway projections from the stationary state to the reciprocating state.

6. An assembly as claimed in claim 5 wherein the locking plates further comprises beveled edges positioned to facilitate receipt of the locator nubs in the receiving slots.

7. An assembly as claimed in claim 1 wherein:
   the reciprocating electrode supports comprise electrode engaging ends that reciprocate between the inner electrode-engaging periphery and the outer retracted periphery;
   the reciprocating electrode supports comprise purge gas passageways that extends from respective purge gas inlets that are positioned outside of the mounting recess when the reciprocating electrode supports are positioned at the inner electrode-engaging periphery to respective purge gas outlets that are positioned in the mounting recesses when the reciprocating electrode supports are positioned at the outer retracted periphery.

8. An assembly as claimed in claim 7 wherein:
   the reciprocating electrode supports comprise longitudinal axes; and
   the purge gas passageways extend along the longitudinal axes.

9. An assembly as claimed in claim 1 wherein the reciprocating electrode supports are configured to reciprocate between the inner electrode-engaging periphery and the outer retracted periphery along respective linear reciprocating paths.

10. An assembly as claimed in claim 9 wherein the reciprocating electrode supports comprise respective support pins aligned with the linear reciprocating paths.

11. An assembly as claimed in claim 10 wherein the mounting recesses of the backing plate comprise axial bores aligned with the linear reciprocating paths.

12. An assembly as claimed in claim 1 wherein the reciprocating electrode supports comprise keyway projections.

13. An assembly as claimed in claim 1 wherein the peripherally engaging electrode carrier comprises a plurality of carrier supports that define support plane displaced from the electrode accommodating aperture.

14. An assembly as claimed in claim 1 wherein the assembly further comprises a tripod stand comprising at least three carrier supports that interface with the electrode carrier.

15. A peripherally engaging electrode carrier comprising a carrier frame and a plurality of reciprocating electrode supports, wherein:
- the carrier frame comprises an electrode accommodating aperture;
- the reciprocating electrode supports are configured to reciprocate between an inner electrode-engaging periphery and an outer retracted periphery along respective linear reciprocating paths;
- the inner electrode-engaging periphery is smaller than the electrode accommodating aperture;
- the outer retracted periphery is larger than the inner electrode-engaging periphery;
- the carrier frame comprises a plurality of keyway slots that are configured to define termination points of corresponding ones of the linear reciprocating paths;
- the reciprocating electrode supports comprise keyway projections that cooperate with the keyway slots to restrict movement along the linear reciprocating paths at the termination points of the linear reciprocating paths.

16. A peripherally engaging electrode carrier comprising a carrier frame and a plurality of reciprocating electrode supports, wherein:
- the carrier frame comprises an electrode accommodating aperture;
- each of the reciprocating electrode supports comprises an electrode engaging end that reciprocates between an inner electrode-engaging periphery and an outer retracted periphery;
- the inner electrode-engaging periphery is smaller than the electrode accommodating aperture;
- the outer retracted periphery is larger than the inner electrode-engaging periphery; and
- the reciprocating electrode support comprises a purge gas passageway that extends from a purge gas inlet displaced from the electrode engaging end of the electrode support to a purge gas outlet that is proximate to the electrode engaging end of the electrode support.

* * * * *